United States Patent [19]

Mitarai

[11] 4,006,470
[45] Feb. 1, 1977

[54] READ-ONLY MEMORY

[75] Inventor: Hajime Mitarai, Komae, Japan

[73] Assignee: Canon Kabushiki Kaisha, Tokyo, Japan

[22] Filed: June 30, 1975

[21] Appl. No.: 591,717

[30] Foreign Application Priority Data

July 3, 1974 Japan .............................. 49-76074

[52] U.S. Cl. .................... 340/173 SP; 340/166 R; 340/173 R
[51] Int. Cl.² ....................................... G11C 11/36
[58] Field of Search .......... 179/15 BC; 340/173 SP, 340/174 SP, 146.3 MA, 166 R, 173 AM

[56] References Cited

UNITED STATES PATENTS

| 3,721,964 | 3/1973 | Barrett et al. | 340/166 R |
| 3,774,171 | 11/1973 | Regitz | 340/173 SP |
| 3,914,620 | 10/1975 | Millhollan et al. | 340/166 R |

*Primary Examiner*—Thomas A. Robinson
*Attorney, Agent, or Firm*—Fitzpatrick, Cella, Harper & Scinto

[57] ABSTRACT

A read-only memory is provided with a multiplexer unit having at least one merged column. Thus, the read-only memory occupies a greatly reduced space.

3 Claims, 20 Drawing Figures

| INPUTS | | | | | OUTPUT |
|---|---|---|---|---|---|
| $I_5$ | $I_4$ | $I_3$ | $I_2$ | $I_1$ | f |
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | d |
| 0 | 0 | 1 | 1 | 0 | 0 |
| 0 | 0 | 1 | 1 | 1 | d |
| 0 | 1 | 0 | 0 | 0 | 1 |
| 0 | 1 | 0 | 0 | 1 | 0 |
| 0 | 1 | 0 | 1 | 0 | 1 |
| 0 | 1 | 0 | 1 | 1 | 0 |
| 0 | 1 | 1 | 0 | 0 | 1 |
| 0 | 1 | 1 | 0 | 1 | d |
| 0 | 1 | 1 | 1 | 0 | 1 |
| 0 | 1 | 1 | 1 | 1 | 0 |
| 1 | 0 | 0 | 0 | 0 | 0 |
| 1 | 0 | 0 | 0 | 1 | 0 |
| 1 | 0 | 0 | 1 | 0 | 1 |
| 1 | 0 | 0 | 1 | 1 | 1 |
| 1 | 0 | 1 | 0 | 0 | 0 |
| 1 | 0 | 1 | 0 | 1 | 0 |
| 1 | 0 | 1 | 1 | 0 | 0 |
| 1 | 0 | 1 | 1 | 1 | 1 |
| 1 | 1 | 0 | 0 | 0 | 0 |
| 1 | 1 | 0 | 0 | 1 | 0 |
| 1 | 1 | 0 | 1 | 0 | 1 |
| 1 | 1 | 0 | 1 | 1 | 0 |
| 1 | 1 | 1 | 0 | 0 | 1 |
| 1 | 1 | 1 | 0 | 1 | 1 |
| 1 | 1 | 1 | 1 | 0 | 0 |
| 1 | 1 | 1 | 1 | 1 | 0 |

| COLUMN NO. | 1 | 2 | 3 | 4 |
|---|---|---|---|---|
| $y_1$ | X | X | 0 | 1 |
| $y_2$ | 1 | 0 | X | 1 |
| $y_3$ | 0 | 1 | 1 | 1 |

| $x_2$ | $x_1$ | | | | |
|---|---|---|---|---|---|
| 0 | 0 | 1 | 0 | 0 | 1 |
| 0 | 1 | 0 | 0 | 0 | 1 |
| 1 | 0 | 1 | 0 | 1 | 0 |
| 1 | 1 | 0 | 1 | 0 | 0 |

OUTPUT f"

FIG. 9A

| | INPUTS $I_5$ $I_4$ $I_3$ $I_2$ $I_1$ | OUTPUT f |
|---|---|---|
| 1 | 0 0 0 0 0 | 0 |
| 2 | 0 0 0 0 1 | 0 |
| 3 | 0 0 0 1 0 | 0 |
| 4 | 0 0 0 1 1 | 0 |
| 5 | 0 0 1 0 0 | 0 |
| 6 | 0 0 1 0 1 | d |
| 7 | 0 0 1 1 0 | 0 |
| 8 | 0 0 1 1 1 | d |
| 9 | 0 1 0 0 0 | 1 |
| 10 | 0 1 0 0 1 | 0 |
| 11 | 0 1 0 1 0 | 1 |
| 12 | 0 1 0 1 1 | 0 |
| 13 | 0 1 1 0 0 | 1 |
| 14 | 0 1 1 0 1 | d |
| 15 | 0 1 1 1 0 | 1 |
| 16 | 0 1 1 1 1 | 0 |
| 17 | 1 0 0 0 0 | 0 |
| 18 | 1 0 0 0 1 | 0 |
| 19 | 1 0 0 1 0 | 1 |
| 20 | 1 0 0 1 1 | 1 |
| 21 | 1 0 1 0 0 | 0 |
| 22 | 1 0 1 0 1 | 0 |
| 23 | 1 0 1 1 0 | 0 |
| 24 | 1 0 1 1 1 | 1 |
| 25 | 1 1 0 0 0 | 0 |
| 26 | 1 1 0 0 1 | 0 |
| 27 | 1 1 0 1 0 | 1 |
| 28 | 1 1 0 1 1 | 0 |
| 29 | 1 1 1 0 0 | 1 |
| 30 | 1 1 1 0 1 | 1 |
| 31 | 1 1 1 1 0 | 0 |
| 32 | 1 1 1 1 1 | 0 |

FIG. 9B

| | FUNDAMENTAL PRODUCTS | |
|---|---|---|
| | $I_5$ $I_4$ $I_3$ $I_2$ $I_1$ | $I_1$ $I_2$ $I_3$ $I_4$ $I_5$ |
| 1 | 0 1 0 0 0 | 0 1 1 0 0 |
| 2 | 0 1 0 1 0 | 0 1 1 0 1 |
| 3 | 0 1 1 0 0 | 1 1 1 0 1 |
| 4 | 0 1 1 1 0 | 0 1 1 0 0 |
| 5 | 1 0 0 1 0 | 1 0 0 1 0 |
| 6 | 1 0 0 1 1 | 1 0 1 0 0 |
| 7 | 1 0 1 1 1 | 0 0 1 0 1 |
| 8 | 1 1 0 1 0 | 0 0 0 1 1 |
| 9 | 1 1 1 0 0 | 1 0 0 0 1 |
| 10 | 1 1 1 0 1 | 1 0 0 0 1 |

FIG. 10A

| $I_5$ | $I_3$ | $I_1$ | $I_1$ | $I_3$ | $I_5$ |
|---|---|---|---|---|---|
| \multicolumn{3}{c|}{Y ADDRESS} | | | |

| $I_5$ | $I_3$ | $I_1$ | $I_1$ | $I_3$ | $I_5$ |
|---|---|---|---|---|---|
| 0 | 0 | 0 | 0 | 1 | 0 |
| 0 | 0 | 0 | 0 | 1 | 1 |
| 0 | 1 | 0 | 1 | 1 | 1 |
| 0 | 1 | 0 | 0 | 1 | 0 |
| 1 | 0 | 0 | 1 | 0 | 0 |
| 1 | 0 | 1 | 1 | 1 | 0 |
| 1 | 1 | 1 | 0 | 1 | 1 |
| 1 | 0 | 0 | 0 | 0 | 1 |
| 1 | 1 | 0 | 1 | 0 | 1 |
| 1 | 1 | 1 | 1 | 0 | 1 |

FIG. 10B

| COLUMN NO. | $I_5$ | $I_3$ | $I_1$ | $I_1$ | $I_3$ | $I_5$ |
|---|---|---|---|---|---|---|
| $C_0$ | 0 | 0 | 0 | 0 | 1 | 0 |
| $C_2$ | 0 | 1 | 0 | 0 | 1 | 0 |
| $C_4$ | 1 | 0 | 0 | 0 | 0 | 0 |
| $C_5$ | 1 | 0 | 1 | 1 | 1 | 0 |
| $C_6$ | 1 | 1 | 0 | 1 | 0 | 1 |
| $C_7$ | 1 | 1 | 1 | 0 | 0 | 1 |

FIG. 11A

| COLUMN NO. | | $C_0$ | $C_1$ | $C_2$ | $C_3$ | $C_4$ | $C_5$ | $C_6$ | $C_7$ | |
|---|---|---|---|---|---|---|---|---|---|---|
| | | 0 | 1 | 0 | 1 | 0 | 1 | 0 | 1 | $I_1$ |
| | | 0 | 0 | 1 | 1 | 0 | 0 | 1 | 1 | $I_3$ |
| $I_4$ | $I_2$ | 0 | 0 | 0 | 0 | 1 | 1 | 1 | 1 | $I_5$ |
| 0 | 0 | 0 | 0 | 0 | d | 0 | 0 | 0 | 0 | |
| 0 | 1 | 0 | 0 | 0 | d | 1 | 1 | 0 | 1 | |
| 1 | 0 | 1 | 0 | 1 | d | 0 | 0 | 1 | 1 | |
| 1 | 1 | 1 | 0 | 1 | 0 | 1 | 0 | 0 | 0 | |

FIG. 11B

| COLUMN NO | | $C_0 \cdot C_2$ | $C_4$ | $C_5 \cdot C_7$ | $C_6 \cdot C_7$ | |
|---|---|---|---|---|---|---|
| | | 0 | 0 | 1 | X | $I_1$ |
| | | X | 0 | X | 1 | $I_3$ |
| $I_4$ | $I_2$ | 0 | 1 | 1 | 1 | $I_5$ |
| 0 | 0 | 0 | 0 | 0 | C | |
| 0 | 1 | 0 | 1 | 1 | 0 | |
| 1 | 0 | 1 | 0 | 0 | 1 | |
| 1 | 1 | 1 | 1 | 0 | 0 | |

FIG. 12A

| FUNCTION CONTROL INPUTS $C_0$ $C_1$ $C_2$ $C_3$ | BOOLEAN NAME | LOGIC SYMBOL |
|---|---|---|
| 0 0 0 0 | 0 | 0 |
| 0 0 0 1 | AND | $AB$ |
| 0 0 1 0 | A AND NOT B | $A\bar{B}$ |
| 0 0 1 1 | A | $A$ |
| 0 1 0 0 | B AND NOT A | $\bar{A}B$ |
| 0 1 0 1 | B | $B$ |
| 0 1 1 0 | EXCLUSIVE OR | $A \oplus B$ |
| 0 1 1 1 | OR | $A+B$ |
| 1 0 0 0 | NOR | $\overline{A+B}$ |
| 1 0 0 1 | EQUAL | $A=B$ |
| 1 0 1 0 | NOT B | $\bar{B}$ |
| 1 0 1 1 | A OR NOT B | $A+\bar{B}$ |
| 1 1 0 0 | NOT A | $\bar{A}$ |
| 1 1 0 1 | B OR NOT A | $\bar{A}+B$ |
| 1 1 1 0 | NAND | $\overline{AB}$ |
| 1 1 1 1 | 1 | 1 |

FIG. 12B

|  | $C_3$ | 0 1 0 1 0 1 0 1 0 1 0 1 0 1 0 1 |
|---|---|---|
|  | $C_2$ | 0 0 1 1 0 0 1 1 0 0 1 1 0 0 1 1 |
|  | $C_1$ | 0 0 0 0 1 1 1 1 0 0 0 0 1 1 1 1 |
|  | $C_0$ | 0 0 0 0 0 0 0 0 1 1 1 1 1 1 1 1 |
| A B | | |
| 0 0 | | 0 0 0 0 0 0 0 0 1 1 1 1 1 1 1 1 |
| 0 1 | | 0 0 0 0 1 1 1 1 0 0 0 0 1 1 1 1 |
| 1 0 | | 0 0 1 1 0 0 1 1 0 0 1 1 0 0 1 1 |
| 1 1 | | 0 1 0 1 0 1 0 1 0 1 0 1 0 1 0 1 |

FIG. 12C

|  | $C_3$ | 1 X X X |
|---|---|---|
|  | $C_2$ | X 1 X X |
|  | $C_1$ | X X 1 X |
|  | $C_0$ | X X X 1 |
| A B | | |
| 0 0 | | 0 0 0 1 |
| 0 1 | | 0 0 1 0 |
| 1 0 | | 0 1 0 0 |
| 1 1 | | 1 0 0 0 |

4,006,470

READ-ONLY MEMORY

BACKGROUND OF THE INVENTION

1. Field of the Invention

This invention relates to a read-only memory which can be constructed in a small size, and more particularly to a read-only memory whose multiplexer unit can be simplified and whose memory-cell matrix unit can accordingly be simplified to thereby greatly reduce the space occupied by the entire chip.

2. Description of the Prior Art

The conventional multiplexer unit has only functioned as the Y decoder for X–Y inputs and has been of the fixed type. The present invention intends to simplify the multiplexer unit in advance by a technique which will hereinafter be described, and thereby reduce the overall size of the device.

SUMMARY OF THE INVENTION

If a read-only memory could be designed to smaller dimensions than before, it would then become possible to provide within the conventional dimensions more blank portions in which a parity check unit or other functional components could be accommodated. This would lead to the provision of a read-only memory in which relatively more functions can be accommodated for the same dimensions, as compared with the prior art memories. Naturally, a similar read-only memory could also be provided in the blank portion to thereby increase the degree of intensiveness on the wafer. This would be highly effective to enhance the yield of wafer manufacture.

According to the present invention, there is provided a read-only memory which is provided with a multiplexer unit having at least one merged column.

The invention will become more fully apparent from the following detailed description thereof taken in conjunction with the accompanying drawings.

DESCRIPTION OF THE PREFERRED EMBODIMENTS

Figure 1:
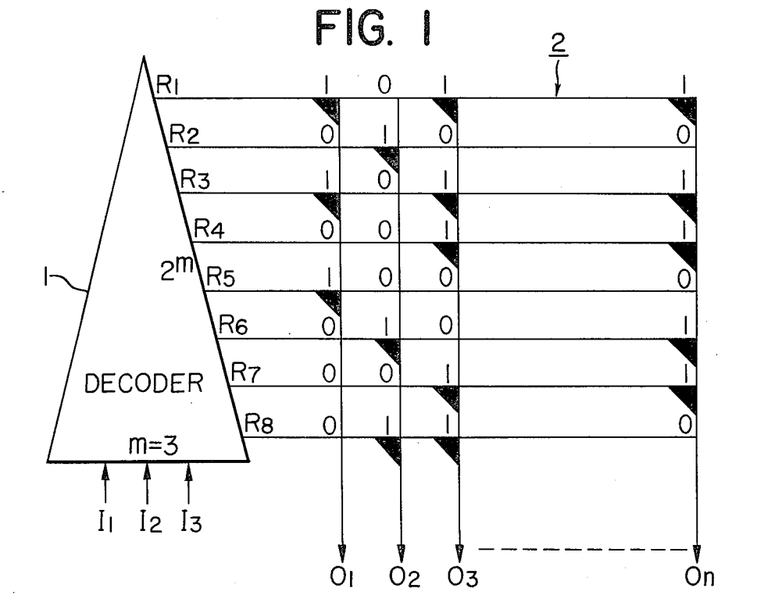
FIGS. 1 and 2 show examples of the conventional read-only memory.
Figure 2:
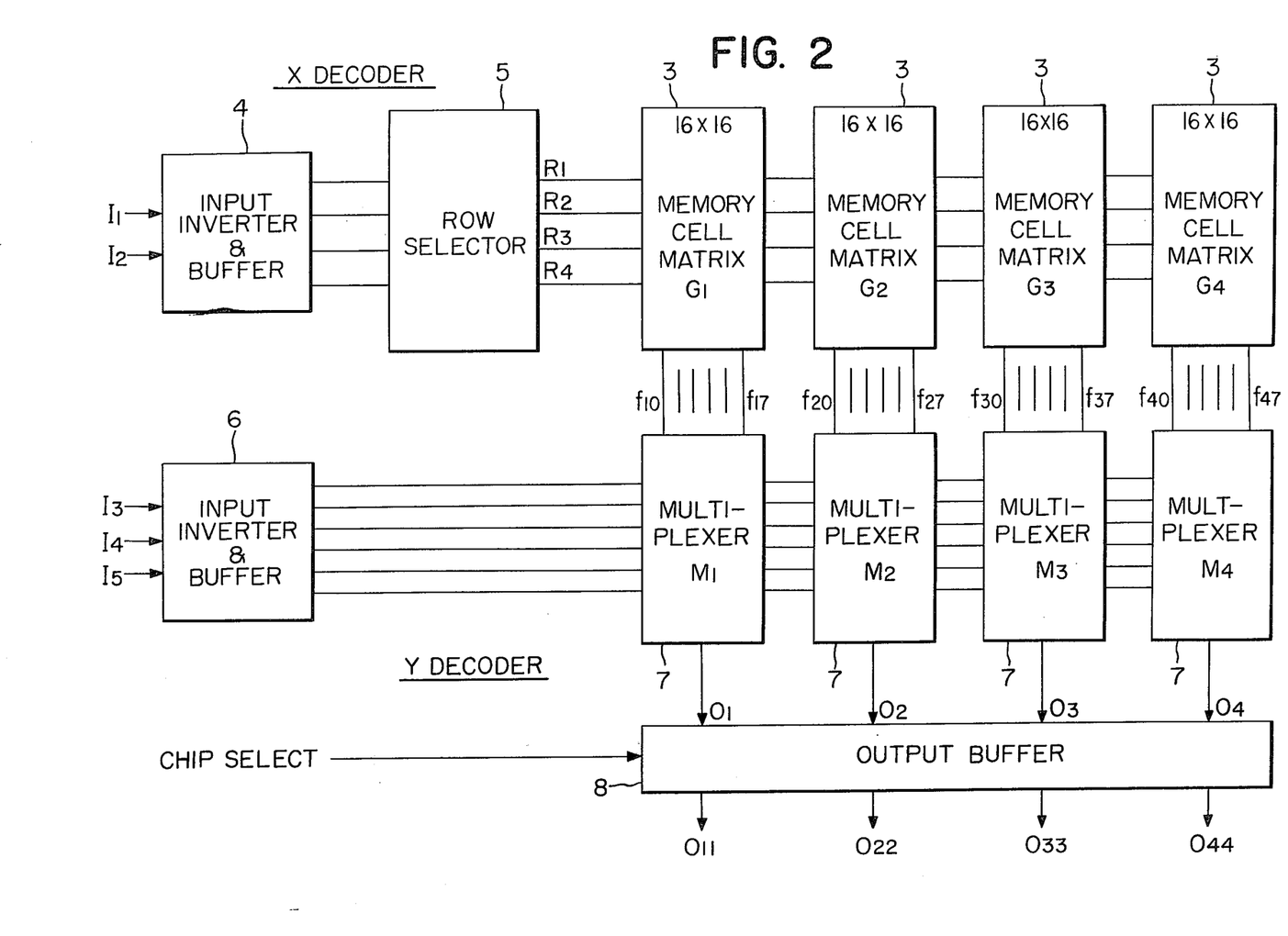

The constructions of read-only memories (ROM) can be classified into two types, namely, the linear selection type shown in FIG. 1 and the coincident selection type shown in FIG. 2. The linear selection type is a simple construction consisting of a decoder 1 and a memory-cell array 2 as shown, in which, for example, a plurality of inputs comprising combinations of $I_1$–$I_3$ are passed through the decoder 1 to select one of rows $R_1$–$R_8$ of the memory-cell array 2 so that logic 1 (shown as a black triangle) or logic 0 stored in said one row is derived as an output signal on each of the output lines $O_1$–$O_n$. The coincident selection type is such that, as shown in FIG. 2, inputs $I_1$–$I_5$ are partitioned into X inputs $I_1,I_2$ and Y inputs $I_3$, $I_4$, $I_5$, for instance. X inputs $I_1,I_2$ are entered into an X decoder comprising an input inverter and buffer unit 4 and a row selector unit 5 so as to select one of rows $R_1$–$R_4$. The content stored in said one row is derived as a combination signal of outputs $f_0$–$f_7$ and applied to a Y decoder which carries out row selection.

The Y decoder comprises an input inverter and buffer unit 6 and a row decoder 7 into which Y inputs $I_3,I_4,I_5$ are entered, and a plurality of a combination of signals $I_3,I_4$ and $I_5$ and a combination of signals $f_{i0}$–$f_{i7}$, wherein $i = 1$ to 4 as shown in FIG. 2, are applied to the Y decoder, whereby one of $f_{i0}$–$f_{i7}$ is selected for outputs $O_1$–$O_4$ to provide the output of the ROM. The row decoder 7 is functionally identical with a multiplexer and is hereinafter referred to as multiplexer.

The present invention intends to simplify the multiplexer unit by the use of means which will hereinafter be described, and accordingly reduce the chip size of the memory-cell array forming the ROM. The technique of simplification of the multiplexer unit according to the present invention will first be explained briefly.

Figure 3:
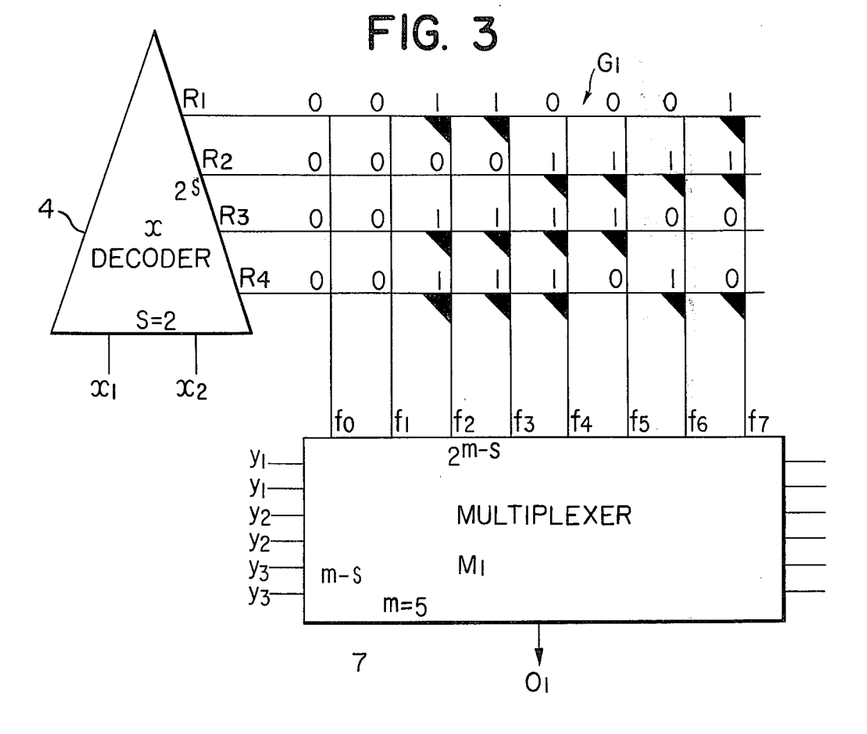
FIG. 3 shows details of FIG. 2.

FIG. 3 shows only that portion of FIG. 2 which is concerned with one ROM output $-O_1$.

Figure 4:
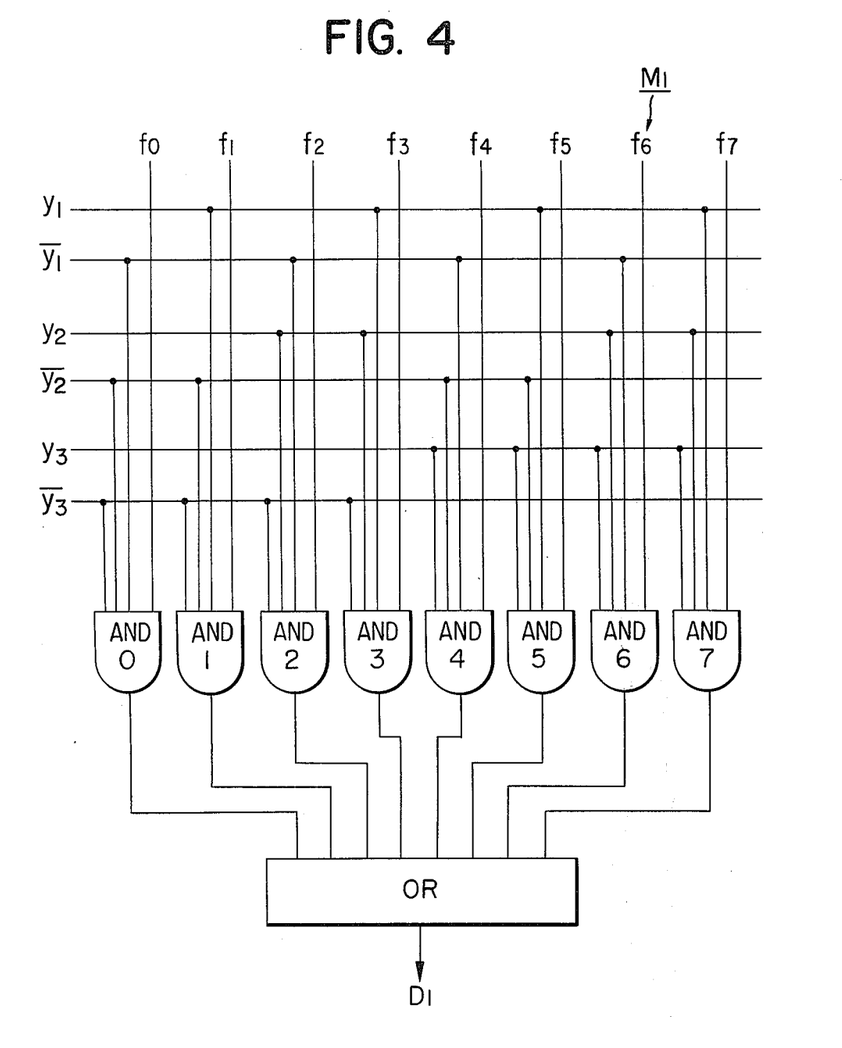
FIG. 4 shows internal details of the multiplexer unit of FIG. 3.

If, as shown in FIG. 3, the number of X inputs is 2 and that of Y inputs is 3, the function $f$ of these five variables $(x_1,x_2,y_1,y_2,y_3)$ may be described by the use of Shannon's expansion theorem, as follows: $f(x_1,x_2,y_1,y_2,y_3)=f_0(x_1,x_2)\bar{y}_1\bar{y}_2\bar{y}_3+f_1(x_1,x_2)y_1\bar{y}_2\bar{y}_3+f_2(x_1,x_2)\bar{y}_1y_2\bar{y}_3+f_3(x_1,x_2)y_1y_2\bar{y}_3 +f_4(x_1,x_2)\bar{y}_1\bar{y}_2y_3+f_5(x_1,x_2)y_1\bar{y}_2y_3+f_6(x_1,x_2)\bar{y}_1y_2y_3+f_7(x_1,x_2)y_1y_2y_3$ This expansion formula may be represented by a logic diagram as shown in FIG. 4. From FIG. 4, which discloses only a portion $M_1$ of the multiplexer unit, it can be seen that the multiplexer 7 is made of simple AND gates AND0-AND7 and OR gate OR, the number of the AND gates being equal to the number of terms appearing in the foregoing expansion formula.

The circuit of FIG. 4 may be simplified by the use of techniques which will be described below.

1. If, in the case of FIG. 3, for example, $f_0$ and $f_1$ among the outputs $f_0$–$f_7$ of the cell matrix $G_1$ are in the relation that $f_0=f_1=0$ for all X inputs (in the case of FIG. 3, all combinations of $x_1,x_2$), then the AND gates AND0 and AND1 may be eliminated in FIG. 4. This shows that when Y inputs $(y_1, y_2, y_3)$ are (0,0,0,) or (1,0,0,), the output is 0 irrespective of the X inputs.

2. If $f_2 = f_3$ for all X inputs, it will be possible from the following equation to replace the AND gates AND2 and AND3 by a single AND gate. $f_2 \bar{y}_1 y_2 \bar{y}_3 + f_3 y_1 y_2 \bar{y}_3 = f_2 y_2 \bar{y}_3$ Thus, the inputs of this new single AND gate are $f_2, y_2$ and $\bar{y}_3$ and it may be replaced by an AND gate AND2 shown in FIG. 5 and, when Y inputs $(y_1, y_2, y_3)$ are (X,1,0), there is provided an output 1.

3. If $f_4 = f_5 + f_6$ for all X inputs, the AND gates AND4, AND5 and AND6 may be replaced by two AND gates, shown in the following equation.

$$f_4 \bar{y}_1 \bar{y}_2 y_3 + f_5 y_1 \bar{y}_2 y_3 + f_6 \bar{y}_1 y_2 y_3 = (f_5 + f_6) \bar{y}_1 \bar{y}_2 y_3 + f_5 y_1 \bar{y}_2 y_3 + f_6 (\bar{y}_1 y_2 y_3) = f_5 \bar{y}_2 y_3 + f_6 \bar{y}_1 y_3$$

Figure 5:
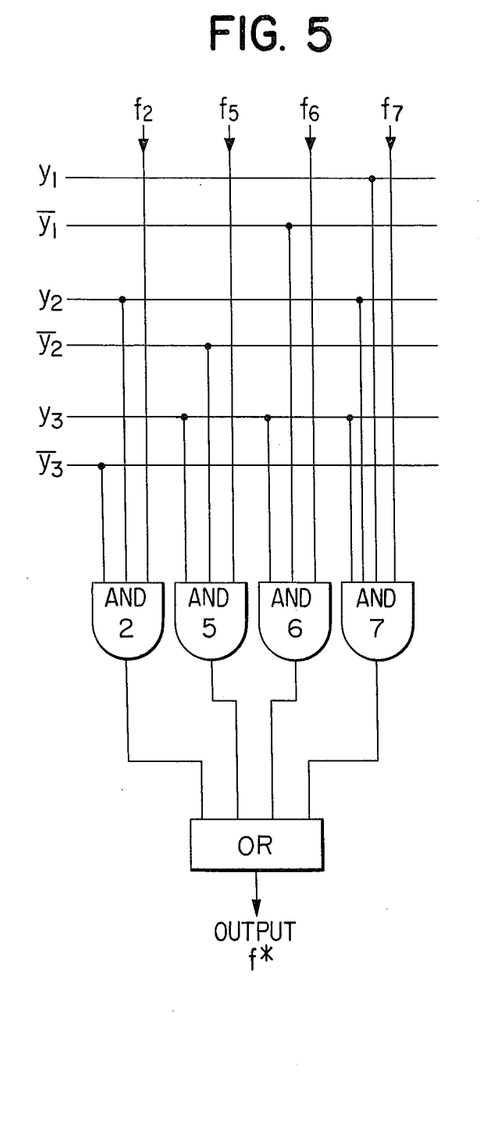
FIG. 5 illustrates an example of the multiplexer simplified according to the present invention.

Thus, the inputs of the two AND gates are $(f_5, \bar{y}_2, y_3)$ and $(f_6, \bar{y}_1, y_3)$, respectively, and these gates may be replaced by AND gates AND5 and AND6 shown in FIG. 5. Accordingly, as a final result, the number of AND gates are reduced from 8 to 4 as een in FIG. 5, and the number of rows in the memory-cell matrix $G_1$ is correspondingly reduced from 8 to 4, so that the ROM can be made with the space for the cell matrix $G_1$ and the portion $M_1$ of the multiplexer 7 reduced to one-half, as compared with the construction of FIG. 4.

Figure 6:
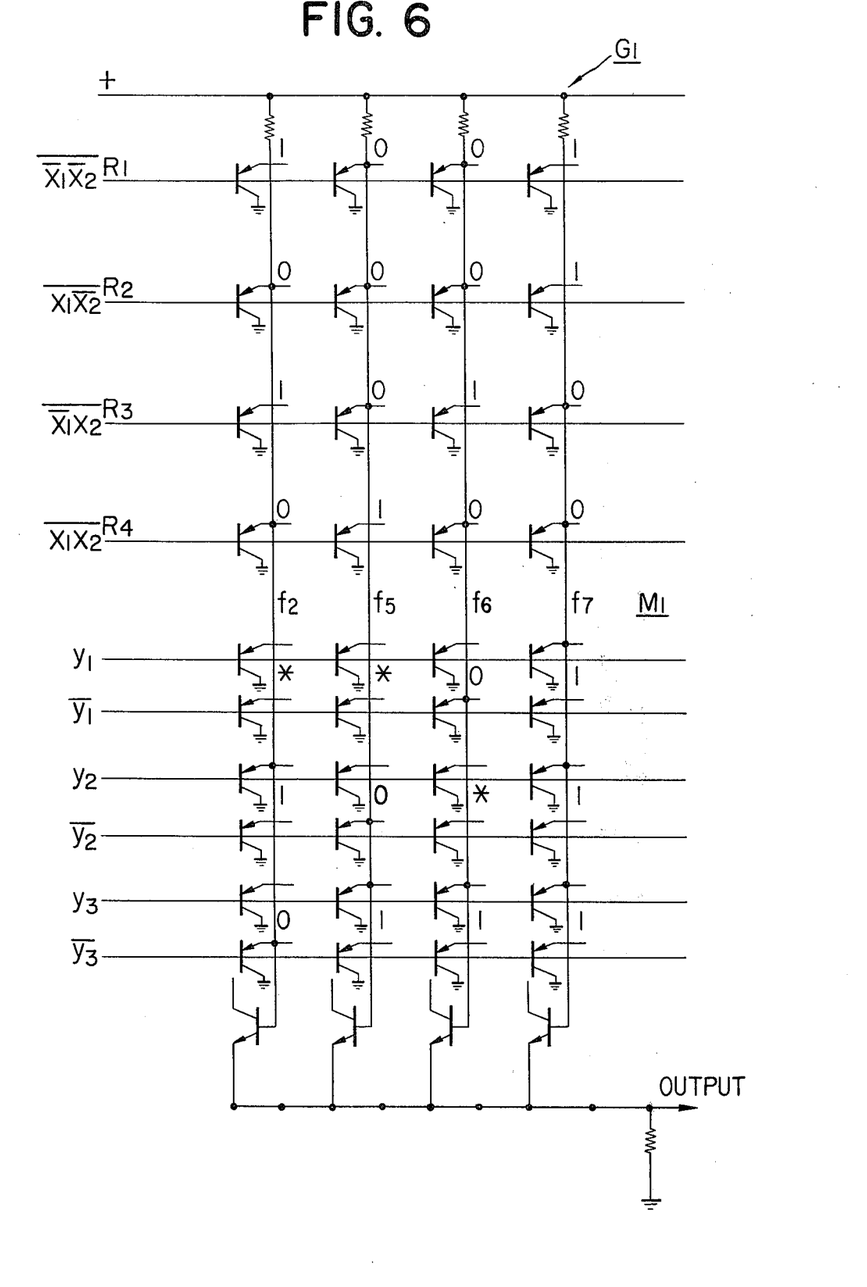
FIG. 6 is a diagram of a specific circuit modified from the construction of FIG. 5.

FIG. 6 shows an example in which the construction of FIG. 5 and the simplified memory-cell matrix $G_1$ are formed by PNP transistors with grounded collectors. Connecting or not connecting the emitter terminal of a transistor to a column line corresponds to the logic 0 or 1 stored in the memory-cell matrix $G_1$, and the multiplexer $M_1$ determines the input terminals of the AND gates. In this manner, the technique of simplification described herein can be directly utilized for the actual manufacture and programming of the ROM.

A similar technique may likewise be applied to the memory-cell matrixes $G_2, G_3, G_4$ and multiplexers $M_2, M_3, M_4$ to minimize the overall dimensions.

Definitions of necessary terms will now be given to explain the above-mentioned techniques (1) to (3) in greater detail.

DEFINITION 1

The set of $m$ input variables may be partitioned into two subsets, i.e. $X = \{x_1, x_2, \ldots, x_s\}$ and $y = \{y_1, y_2, \ldots, y_{m-s}\}$. A partition-matrix representation of a function $f$ means an array of $2^m$ functional values expressed by a matrix of $2^s$ rows and $2^{m-s}$ columns. In this matrix, the rows correspond to $2^s$ distinct combinations of the X inputs and the columns to $2^{m-s}$ distinct combinations of the Y inputs.

Each position in the matrix is the value of the function $f$ which corresponds to a new combination of X and Y inputs.

Transformation of a truth table for a certain logic expression into a given partition matrix of X and Y inputs is very simple. For example, the truth table shown in FIG. 7A, if $X = \{I_1, I_2\}$ and $Y = \{I_3, I_4, I_5\}$, will be transformed into a partition matrix as shown in FIG. 7B. A well-known example is a Karnaugh map, which is a 4×4 partition matrix.

DEFINITION 2

A column $C_i$ in a partition matrix contains $2^s$ ordered elements, each of which assumes the value of 0, 1 or $d$ (don't care). The value $d$ is a normally unused code and for example, when decimal numbers 0 to 9 are encoded into binary coded decimal characters, six of the sixteen codes are represented by $d$. The column $C_i$ has a $y$ address $i$, expressed as $i = y_1^*, y_2^*, \ldots, y_{m-s}^*$. Address $i$ can also be represented by a binary character if $\bar{y}_s$ is represented by 0, $y_s$ by 1, and the missing $y_s$ by X.

DEFINITION 3.

If a column $C_i$ contains only 0's and/or d's, such column $C_i$ is called a 0 column. In FIG. 7B, the column No. 1 is regarded as 0 column.

DEFINITION 4.

If and only if columns $C_i$ and $C_j$ agree in every place except d, it is said that there is the intersection between $C_i$ and $C_j$. For example, if $C_i = [0\ 1\ 1\ d\ 0\ 1\ d\ d\ 0]^T$ and $C_j = [0\ d\ 1\ 1\ d\ 1\ d\ 0\ 0]^T$, all the corresponding values except d agree. Thus, in such case, the intersection exists between $C_i$ and $C_j$.

In FIG. 7B, an intersection exists between columns Nos. 3 and 4.

DEFINITION 5.

If and only if the $y$ addresses of columns $C_i$ and $C_j$ differ only in one character, it is said that these columns have neighboring addresses. For example, in FIG. 7B, among the $y$ addresses of columns Nos. 3 and 4, only the $y_1$ address has different characters 0 and 1 and thus, columns Nos. 3 and 4 have neighboring addresses.

DEFINITION 6.

If and only if an intersection exists between two columns $C_i$ and $C_j$ having neighboring addresses, the columns $C_i$ and $C_j$ are compatible. For example, in FIG. 7B, columns Nos. 3 and 4 are compatible because they have neighboring addresses and have the intersection therebetween as noted above.

DEFINITION 7.

In columns $C_i, C_j$ having neighboring addresses, if all elements of $C_j$ are 1 while the corresponding elements of $C_i$ are always other than 0, then $C_i$ is said to dominate $C_j$, and this relation is written as $C_i > C_j$. For example, when $C_i = [1\ 0\ 1\ 1\ d]^T$ and $C_j = [0\ 0\ d\ 1\ 1]^T$, the elements of $C_i$ corresponding to the elements 1 of $C_j$ are 1 and d and thus, $C_i > C_j$. In FIG. 7B, if columns Nos. 3 and 4 correspond to $C_i$ and $C_j$, respectively, column No. 3 dominates column No. 4 because the elements of column No. 3 corresponding to the elements 1 of column No. 4 are 1. Also, in this case, if columns Nos. 3 and 4 correspond to $C_j$ and $C_i$ respectively, the elements of column No. 4 corresponding to the elements 1 of column No. 3 are 1 and thus, column No. 4 is said to dominate column No. 3.

COROLLARY 1 The necessary and sufficient conditions for two columns $C_i$ and $C_j$ to be compatible are that $C_i > C_j$ and $C_j > C_i$ at one time.

DEFINITION 8.

The product of $C_i$ and $C_j$ (written as $C_i \wedge C_j$) is defined as follows:

If $C_i$ and $C_j$ are of the same length and if both of $C_i$ and $C_j$ contain the element d, the product thereof is d; if either of $C_i$ and $C_j$ contains 0, the product thereof is 0; and in the other cases, the product is 1. For example, if $C_i = (10d1d1)$ and $C_j = (10d100)$, the product $C_i \wedge C_j = (10d100)$.

DEFINITION 9.

If $C_i$ and $C_j$ have neighboring addresses, $C_i$ and $C_j$ can be merged. The merged column (written as $C_i \cdot C_j$)

is the product of $C_i$ and $C_j$ and its address is the logical sum of the y addresses, $i$ and $j$. For example, if $C_i=[1\ 0\ 1\ 0]^T$ and its address $i=\bar{y}_1y_2\bar{y}_3$ and if $C_j=[1\ d\ 1\ 0]^T$ and its address $j=y_1y_2\bar{y}_3$, then $C_i$ and $C_j$ can be merged. The merged column is represented by $C_i \wedge C_j=[1\ 0\ 1\ 0]$ and its address by $i+j=\bar{y}_1y_2\bar{y}_3=y_1y_2\bar{y}_3=y_2\bar{y}_3$. . In FIG. 7B, columns Nos. 3 and 4 can be merged.

DEFINITION 10.

A fundamental product is the logical product of various input elements whose output is 1. For example, in FIG. 7A, the fundamental product of a row whose output $f$ is 1, say, the seventh row, is represented by $\bar{I}_1\bar{I}_2I_3I_4\bar{I}_5$. Thus, when a partition matrix is given in accordance with the above definitions, the number of the columns may be reduced by the following technique.

Step 1: Eliminate 0 columns.
Step 2: Merge all possible pairs of the remaining columns.
Step 3: Iterate steps 1 and 2 until no more columns can be merged.
Step 4: Choose the least number of columns that include all the fundamental products.

These steps are the generalization of the aforementioned techniques (1), (2) and (3).

Figure 7A:
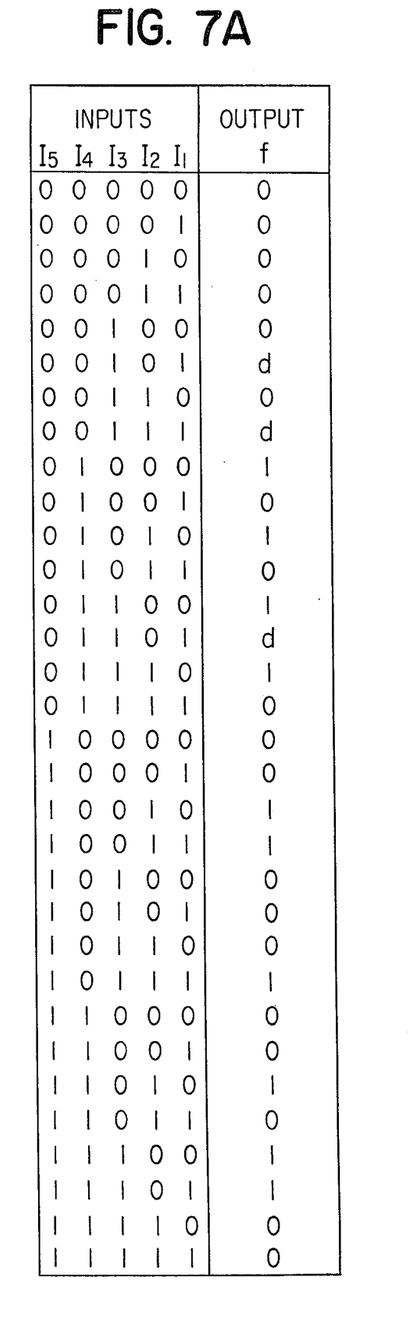
FIG. 7A is an example of a truth table.
Figure 7B:
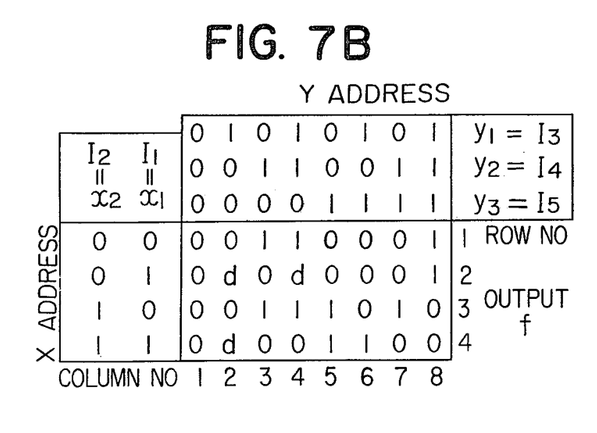
FIG. 7B shows the truth table of FIG. 7A in partitioned form.
Figure 7C:
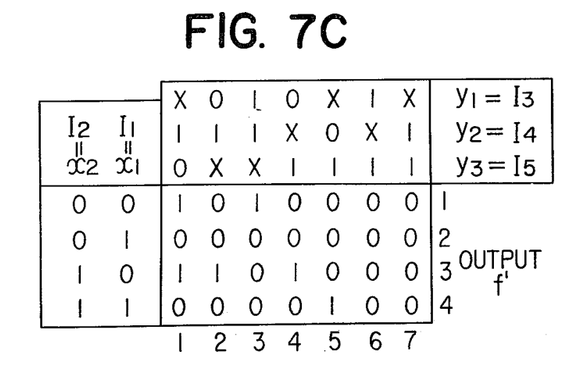
FIG. 7C is a new partition matrix produced in accordance with the present invention.
Figure 7D:
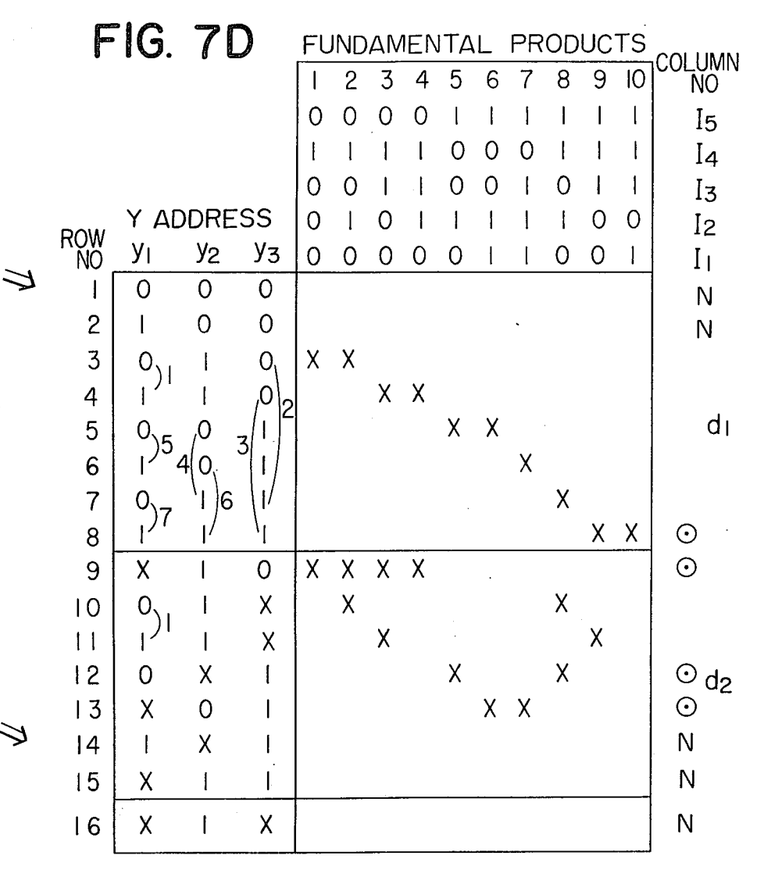
FIG. 7D illustrates the principle used to arrive at the matrix of FIG. 7C.
Figure 8:
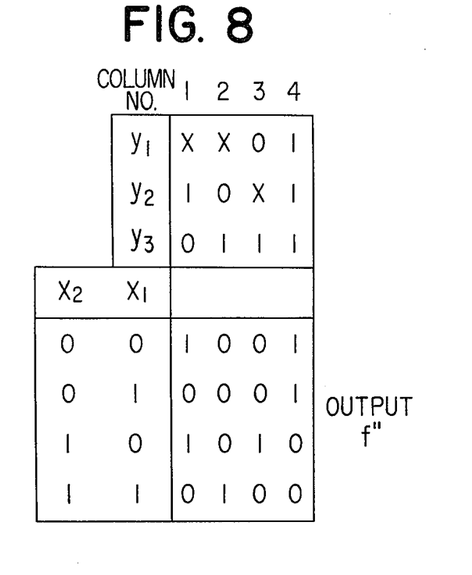
FIG. 8 shows an example of a partition matrix reduced through the procedures shown in FIG. 7.

FIGS. 7B, C and D illustrate the process during which the truth table of FIG. 7A is reduced as shown in FIG. 8 by the use of the foregoing steps 1–4.

More specifically, if the inputs $I_1$–$I_5$ in the truth table of FIG. 7A are partitioned as desired, for example, into $x=2$ and $y=3$, and if $I_1=x_1$, $I_2=x_2$, $I_3=y_1$, $I_4=y_2$ and $I_5=y_3$, then a partition matrix for the FIG. 7A table may be written as shown in FIG. 7B. The y address of each column is rewritten into the form of row and added to the left box of FIG. 7D. The uppermost box in FIG. 7D shows the fundamental products as represented by the binary system and rewritten in the form of columns. Subsequently, in FIG. 7B, the rows $I_1,I_2$ and the columns $I_3,I_4,I_5$ in which the matrix element is 1 are chosen, and the groups of fundamental product elements in which the elements of $I_1$–$I_5$ are identical are chosen from among the columns in FIG. 7D. Also, when those y addresses $y_1$, $y_2,y_3$ with which the y addresses in FIG. 7B are coincident are chosen in FIG. 7, the rows and columns are determined and the points of intersection therebetween are thus marked with X.

For example, in FIG. 7B, the matrix element is 1 at the intersection between the row No. 1 and the column No. 3, and in this row and column, $I_1-I_5=00010$, and the column in which this provides the fundamental product is the column No. 1 in FIG. 7D. Also, the y addresses $y_1,y_2,y_3$ in this case are 010 and so, the y addresses in the row No. 3 in FIG. 7D correspond thereto. Therefore, the intersection between row No. 3 and column No. 1 in FIG. 7D is marked with X. Also, the intersection between row No. 3 and column No. 3 in FIG. 7B is 1 and in that row, $I_1=x_1=0$ and $I_2=x_2=1$ and in that column, $I_3=y_1=0$, $I_4=y_2=1$ and $I_5=y_3=0$. Thus, $I_1-I_5=01010$.

The fundamental product in which the elements are identical is found in column No. 2 of FIG. 7D. Also, in this case, the y addresses $I_3=y_1=0$, $I_4=y_2=1$ and $I_5=y_3=0$ are 010 and so, row No. 3 corresponds thereto, and the intersection between row No. 3 and column No. 2 is marked with X. The marks X are provided through the same procedures to bring about the conditions shown. Next, in FIG. 7D, a mark X is provided at every point of intersection on the rows having their y addresses still unmarked with X. These rows marked with X correspond to the aforesaid O columns and are therefore eliminated. This corresponds to the step 1 previously described. In the present instance, the rows Nos. 1 and 2 are marked with X and eliminated. Subsequently, the remaining rows are subjected to the merging which corresponds to the step 2 previously described, and the elements of the merged rows are additionally written in the last y address row (row No. 8) and on.

More specifically, the y addresses of the rows Nos. 3 and 4 are neighboring addresses and therefore merged, and the new merged row is represented as X, 1, 0 and written in the row No. 9. Likewise, the rows Nos. 3 and 7 may be merged and represented as 0, 1, X, which is written in the row No. 10. In the same manner, the rows Nos. 4 and 8 can be merged and represented as 1, 1, X, the rows Nos. 5 and 7 as 0, X, 1, the rows Nos. 5 and 6 as X, 0, 1, the rows Nos. 7 and 8 as X, 1, 1, and these are written in the rows Nos. 11, 12, 13, 14 and 15, respectively. These new y addresses resulting from the merging are rewritten in the form of columns as shown in FIG. 7C. The x addresses are also rewritten from FIG. 7B into FIG. 7C. At this point, a new partition matrix is introduced by the use of the definitions 8 and 9 described above. More specifically, for example, the matrix element at the intersection between the row No. 1 and the column No. 1 may be obtained in the following manner. The y address X, 1, 0 of the column No. 1 has resulted from the merging of the y addresses of the columns Nos. 3 and 4 in FIG. 7B, while the matrix elements of the x address of the row No. 1 are 1 and 1, respectively, and their logical product is 1. Therefore, this logical product as a newly produced matrix element is written into the intersection between the row No. 1 and the column No. 1 in FIG. 7C. The matrix elements at the y address of the same column No. 1 and the y address at the intersection between the row No. 2 and the column No. 2 correspond to 0 and $d$ at the $x$ address of the row No. 2 at its intersection with the y address columns Nos. 3 and 4 in FIG. 7B, and since the logical product of 0 and $d$ is 0, 0 is placed at the intersection between the row No. 2 and the column No. 1 in FIG. 7C. In this manner, all matrix elements may be obtained as shown. The aforementioned step 1 is again carried out by using this new partition matrix (FIG. 7C) and the new merged y addresses (box $d_2$ in FIG. 7D). It should be noted, however, that step 1 is carried out for both cases where X is 0 and where X is 1, and the point of intersection falling under both of them is marked with X. For example, step 1 is first carried out for the case where X=0.

The y address X, 1, 0 of the column No. 1 in FIG. 7C becomes 0, 1, 0 and the matrix element at the intersection with the $x$ address 0, 0 of the row No. 1 is 1, so that the fundamental product 00010 thereof can be found in the column No. 1 in FIG. 7D. Therefore, the intersection between the row No. 9 and the column No. 1 in the box $d_2$ is marked with X.

Also, where X=1, $I_1$–$I_5$ in FIG. 7C are 00110 and thus, the fundamental product thereof corresponds to that in the column 3 in FIG. 7D, and the intersection between the row No. 9 and the column No. 3 is marked with $X$. Since the element at the intersection between the row No. 3 and the column No. 1 in FIG. 7C is also 1, search is effected with respect to the cases where X=0 and $X=1$. First, where X=0, $I_1$–$I_5$=0,1,0,1,0 and this corresponds to the fundamental product 01010 in the column No. 2 in FIG. 7D, and thus the intersection between the row No. 9 and the column No. 2 is marked with X. Where X=1, $I_1-I_5$=0,1,1,1,0 and this corresponds to the fundamental product in the column No. 4 in FIG. 7D, so the intersection between the row No. 9 and the column No. 4 is marked with X. This completes the X marking for all cases where X=0 and X=1 with respect to the y address in column No. 1 in FIG. 7C. Similar treatment is effected on the y addresses of the succeeding columns Nos. 2-7, whereby X marking is completed as shown in the box $d_2$ of FIG. 7D. Subsequently, as already described, N marking must be effected on the y addresses of the rows still unmarked with X. Such rows are found to be the rows Nos. 14 and 15 as indicated in the box $d_2$, and these are eliminated. Next comes the merging of the remaining rows. The rows Nos. 10 and 11 are the only rows which can be merged, and new merged row X, 1, X is written in the row No. 16. A partition matrix resulting from the new merging as shown in FIG. 7C must now be formed in the following manner. The merged row X, 1, X has resulted from the merging of the columns Nos. 2 and 3 in FIG. 7C and the logical products of their matrix elements are 0,0,0,0, respectively. Thus, no point of intersection which can be marked with X is found in the row No. 16 in FIG. 7D which contains X, 1, X, and this row is marked with N and eliminated. Subsequently, the y address rows are chosen such that they include all the fundamental products in the columns Nos. 1 to 10 and that they are the least in number of rows. In the present instance, if the rows Nos. 8, 9, 12 and 13 are chosen, fundamental products are contained in any of these y address rows, that is, the row No. 8 has a fundamental product at its intersections with the columns Nos. 9 and 10, the row No. 9 at its intersections with the columns Nos. 1 to 4, the row No. 12 at its intersections with the columns Nos. 5 and 8, and the row No. 13 at its intersections with the columns Nos. 6 and 7, and in addition, these y address rows are the least in number (four rows). Thus, the aforementioned rules are sufficiently satisfied. Accordingly, the y address rows Nos. 8, 9, 12 and 13 are marked with ⊙ and these chosen rows may be used as new y addresses to form a reduced partition matrix as shown in FIG. 8. Referring to FIG. 8, the columns Nos. 1, 2, 3 and 4 respectively correspond to the y addresses of the rows Nos. 9, 13, 12 and 8 in FIG. 7D. Also, columns $C_i$ are transcribed by choosing the corresponding columns $C_i$ in FIG. 7C as the columns Nos. 1-3 and the corresponding column $C_i$ in FIG. 7D as the column No. 4.

As a result, the eight columns of y addresses in FIG. 7B are reduced down to four columns as seen in FIG. 8, which means that the space occupied by the Y decoder unit forming the multiplexers is reduced to one-half the space initially occupied, which in turn means that the space occupied by the memory-cell matrix is reduced to nearly one-half, thus permitting the entire read-only memory to be designed with its space reduced to one-half or less. This also leads to reduction in size of the entire data processor and less consumption of electric power, which will be highly effective for the economization and the size reduction of the apparatus.

While the general construction of the read-only memory according to the present invention has hitherto been described, this device may be further reduced in size if optimal partition of the two X-Y inputs can be discovered before the described method is performed. In fact, when there are m inputs, there are $2^m$ methods of partition and it would be tedious to carry out the above-described column reduction for all of these combinations. For this reason, the following steps are added prior to the described steps 1-4 in order to discover an optimal construction which covers such problem of partition.

Pre-step 1: Tabulate an incompatible neighbors table (INT) from the truth table.

Figure 9A:
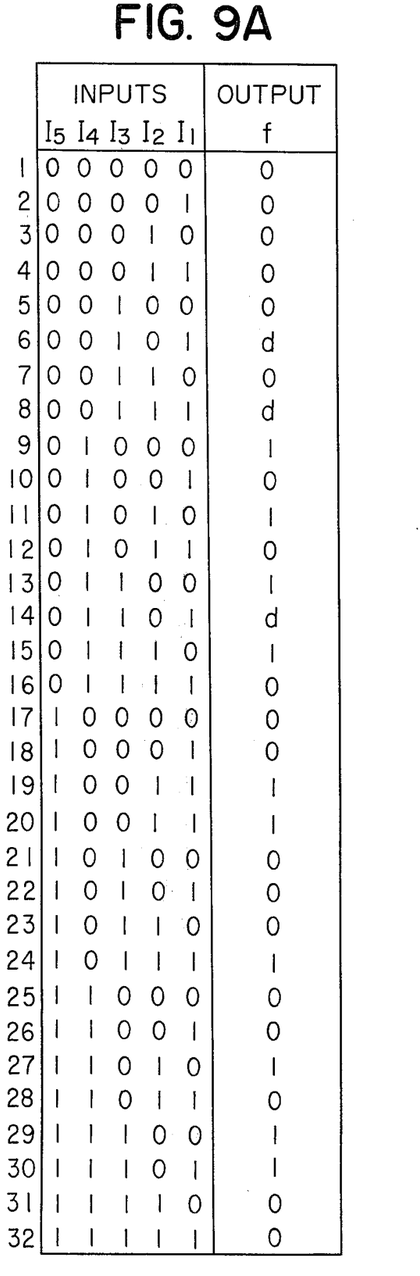
FIG. 9A shows another example of a truth table.
Figure 9B:
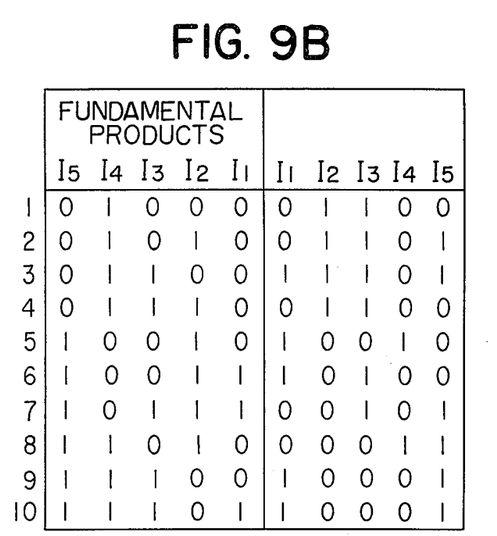
FIG. 9B is an example of an incomplete adjacent table formed on the basis of the truth table in FIG. 9A.
Figure 10A:
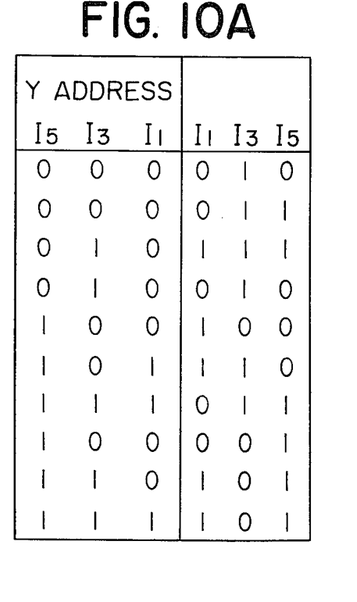
FIG. 10A shows an example of a table which has a certain X input removed from the table of FIG. 9B.

Pre-step 2: Reduce the INT for a given x input partition. Step 1 may be effected only once even when partition of all inputs is attempted. Also, if the INT is reduced (prestep 2), it will result in provision of all the data required in the second of the described steps 1-4. Since the INT is used to estimate the size of the partition matrix, the described steps 1 and 2 may be carried out only for the input partitions that are likely to be optimal. The pre-step 1 which is concerned with the tabulation of the INT will first be explained. From the truth table of FIG. 9a, fundamental products are listed up as shown in the left box of FIG. 9b in the same manner as described in connection with FIG. 8. Further, prepare a row $I_1, I_2, \ldots \bar{I}_i, \ldots, I_m$ in which a certain element $I_i$. . . . $I_m$ is negated, and search for a row coincident with that row in the truth table of FIG. 9a. If the output f of the coincident row is found to be O, place a 0 at the address corresponding to $I_i$, or otherwise 1. When such procedures have been performed for i=1−m, a new row results. For example, $I_5, I_4, I_3, I_2, I_1$ in the row No 1 in FIG. 9b are 0, 1, 0, 0, 0 and therefore, a row 1, 1, 0, 0, 0 which is a negation $I_5$=1 of $I_5$=0 is searched for in the truth table of FIG. 9a, to find that the row No. 25 is 1, 1, 0, 0, 0 and coincident. The output f thereof is found to be 0. Accordingly, 0 is placed under the label $I_5$ in the right box, row No. 1, of FIG. 9b. Subsequently, $I_4$=1 in the fundamental product row No. 1 is rendered to $I_4$=0, whereby this row assumes 0, 0, 0, 0, 0, which is found to correspond to the row No. 1 in the truth table of FIG. 9a. Since the output f of this row is 0, $I_4$=0 is placed under the label $I_4$ in the right box, row No. 1, of FIG. 9b. Next, $I_3$=0 in the fundamental product row No. 1 is rendered to $I_3$=1, whereby this row assumes 0, 1, 1, 0, 0, which is found to correspond to the row No. 13 in the truth table of FIG. 9a. Since the output f of this row is 1, $I_3$=1 is placed under the label $I_3$ in the right box, row No. 1, of FIG. 9b. Subsequently, $I_2$=0 in the fundamental product row No. 1 is likewise rendered to $I_2$=1, whereby this row assumes 0, 1, 0, 1, 0, which is found to correspond to the row No. 11 in the truth table of FIG. 9a. Since the output f of this row is 1, $I_2$=1 is placed under the label $I_2$ in the right box, row No. 1, of FIG. 9b. Finally, $I_1$=0 in the fundamental product row no. 1 is rendered to $I_1$=1, whereby this row assumes 0, 1, 0, 0, 1, which is found to correspond to the row No. 10 in the truth table of FIG. 9a. Since the output f of this row is 0, $I_1$=0 is placed under the label $I_1$ in the right box, row No. 1, of FIG. 9b. In this manner, 0, 1, 0, 0, 0 in the fundamental product row No. 1 in FIG. 9b has been transformed into 0, 1, 1, 0, 0. In the same manner, the succeeding rows Nos. 2 to 10 are transformed to provide the INT as shown. After the tabulation of this INT, any desired x input is chosen and the table of FIG. 9b for the partition of that input may be tabulated by removing the columns corresponding to the x variables from the rows and columns. To illustrate, if $I_2$ and $I_4$ are chosen as the x variables, the table of FIG. 9b reduces to that as shown in FIG. 10a. Also, the row label is now a y address of the partition matrix column that contains the fundamental product. If the matrix column contains more than one fundamental product, the same y address may appear in the INT. For example, in FIG. 10a, the fundamental products $\bar{I}_5I_4\bar{I}_3I_2\bar{I}_1$ and $\bar{I}_5I_4\bar{I}_3I_2I_1$ are contained in the columns whose y address ($I_5I_3I_1$) is (000). The INT can be further reduced by merging the rows with the same y address in the manner already described. The merged row consists of the logical product of the merging rows (see FIG. 10b). This corresponds to pre-step 2.

All the data necessary to reduce the partition matrix can now be extracted from the reduced INT by the use of the following theorems.

THEOREM 1

The y addresses of the 0 columns are missing from the row headings.

THEOREM 2

1 at the intersection of $y_1^=, y_2^=, \ldots, y_p^=, \ldots, y_{m-s}^=$ row and $y_p$ column indicates that a column $C_i$ with its address $i=y_1^=, y_2^=, \ldots, y_p, \ldots, m\_s^=$ is dominated by a column $C_j$ with its address $j=y_1^=, y_2^=, \ldots, y_p^=, \ldots, y_{m-s}^=$ (that is, $C_j > C_i$).

THEOREM 3

Two columns, $C_i$ and $C_j$, are compatible if and only if two dominance relations, $C_i > C_j$ and $C_j > C_i$ are found from the reduced INT by the use of Theorem 2.

Figure 10B:
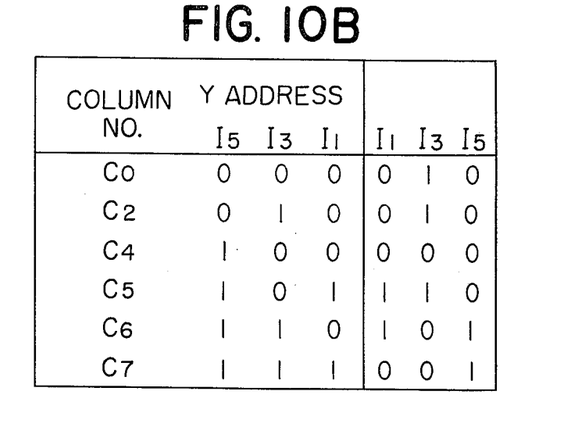
FIG. 10B shows the table in which merging is accomplished.

As a consequence of these theorems, the reduced INT in FIG. 10b yields the following information.

| | |
|---|---|
| "0" columns: | $C_1$ and $C_3$ |
| Dominance relations: | $C_0 < C_2$, $C_2 < C_0$, $C_2 < C_6$, $C_7 < C_6$, $C_4 < C_5$, $C_3 < C_7$, $C_7 < C_5$ |
| Pairs of compatible columns: | $\{C_0, C_2\}$ |

Figure 11A:
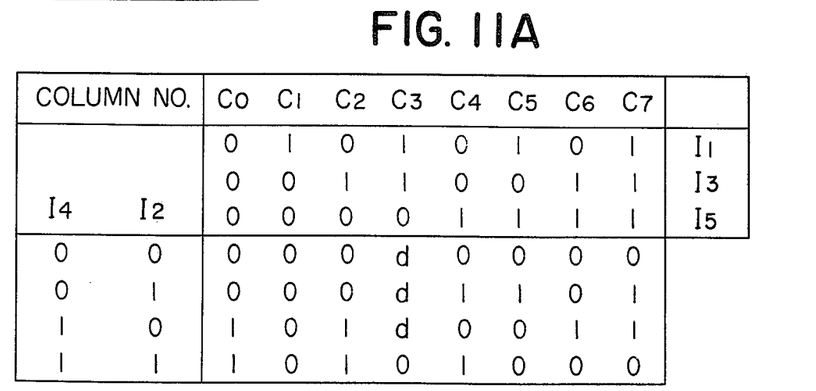
FIG. 11A shows another example of a partition matrix.
Figure 11B:
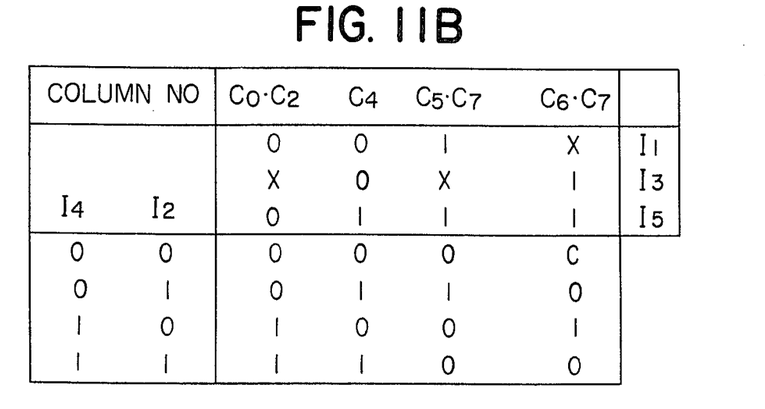
FIG. 11B shows the matrix of FIG. 11A reduced.

With this information obtained, the partition matrix in FIG. 11a can be reduced to that as shown in FIG. 11b.

Figure 12A:
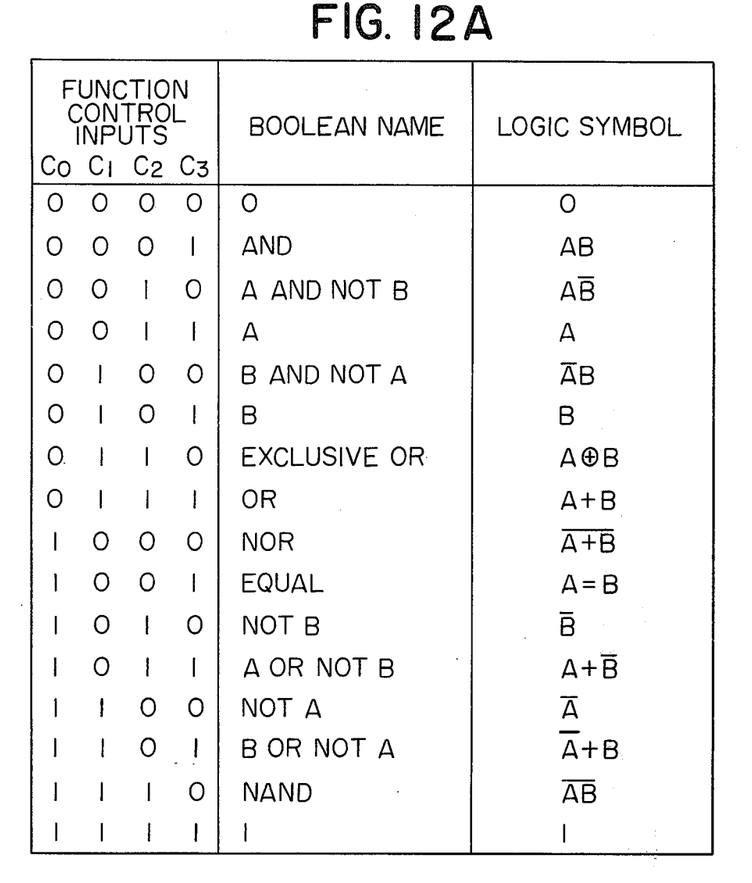
FIG. 12A is a truth table for a universal function generator.
Figure 12B:
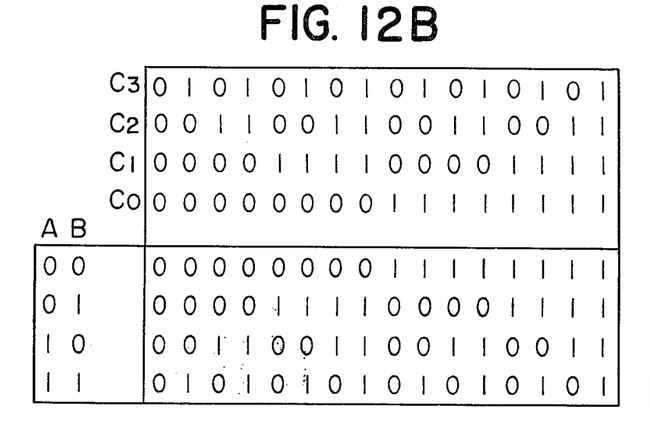
FIG. 12B illustrates the process of reducing the table of FIG. 12A.
Figure 12C:
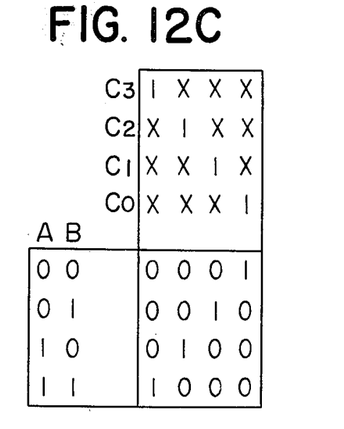
FIG. 12C shows the table of FIG. 12B reduced in accordance with the present invention.

FIG. 12a is the truth table for the read-only memory in a universal logic-function generator, and application of the present invention thereto results in the reduced matrix as shown in FIG. 12C.

I claim:
1. A read-only memory comprising:
   a set of memory cells defining a matrix and having pluralities of row and column conductors;
   multiplexer means including at least one merged column and having a plurality of outputs and first and second pluralities of inputs, said first inputs being coupled respectively to said column conductors of said set of memory cells; and
   row selector means having first and second groups of outputs for providing selection signals to select desired locations of said memory matrix, said first group of outputs being coupled respectively to said row conductors of said set of memory cells, and said second group of outputs being coupled respectively to said second plurality of inputs of said multiplexer means, wherein a row selection of said memory matrix is provided at said plurality of outputs of said multiplexer means.

2. A read-only memory as set forth in claim 1, wherein said multiplexer means and said memory cells comprise an integrated circuit having transistors formed therein.

3. A read-only memory as set forth in claim 1, comprising a plurality of sets of said memory cells, wherein at least one of said memory cell sets includes at least one merged column.

* * * * *

UNITED STATES PATENT OFFICE
CERTIFICATE OF CORRECTION

Patent No. 4,006,470  Dated February 1, 1977

Inventor(s) Hajime Mitarai  Page 1 of 2

It is certified that error appears in the above-identified patent and that said Letters Patent are hereby corrected as shown below:

Column 4, Line 59  Change "$C_i \hat{} c_j$" to read $--C_i \hat{} C_j--$

Column 5, Line 6  Change "=" (second occurrence) to read $--+--$

Column 8, Line 31  Change "$I_5 = 1$" to $--\bar{I}_5 = 1--$

Column 9, Line 26  Change "$Y_1^=, Y_2^=, \ldots, Y_p^=, \ldots, Y_{m-s}$"
to read $--y^*_1, Y^*_2, \ldots Y^*_p, \ldots, Y^*_{m-s}--$ Column 9, Line 27  delete "=";

Column 9, Line 28  Change "$y_1^=, Y_2^=, \ldots Y_p, \ldots, m-s^=$"
to read $--y^*_1, Y^*_2, \ldots, Y^*_p, \ldots Y^*_{m-s}--$ Column 9, Line 29  Change "$y_1^=, y_2^=, \ldots Y_p^=, \ldots$"
to read $--y^*_1, Y^*_2{}^=, \ldots, Y^*_p, \ldots$

UNITED STATES PATENT OFFICE
CERTIFICATE OF CORRECTION

Patent No. 4,006,470  Dated February 1, 1977

Inventor(s) Hajime Mitarai  Page 2 of 2

It is certified that error appears in the above-identified patent and that said Letters Patent are hereby corrected as shown below:

Column 9, line 30, "$y_{m-s}=$" to read --$y^*_{m-s}$--.

Signed and Sealed this

Fourteenth Day of June 1977

[SEAL]

Attest:

RUTH C. MASON  
Attesting Officer

C. MARSHALL DANN  
Commissioner of Patents and Trademarks